US012500204B2

(12) United States Patent
Colosimo, Jr. et al.

(10) Patent No.: US 12,500,204 B2
(45) Date of Patent: Dec. 16, 2025

(54) BONDING SYSTEMS FOR BONDING OF SEMICONDUCTOR ELEMENTS TO SUBSTRATES INCLUDING A GAS COMPOSITION ANALYZER, AND RELATED METHODS

(71) Applicant: Kulicke and Soffa Industries, Inc., Fort Washington, PA (US)

(72) Inventors: Thomas J. Colosimo, Jr., Fort Washington, PA (US); Matthew B. Wasserman, Fort Washington, PA (US); Adeel Bajwa, Fort Washington, PA (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 612 days.

(21) Appl. No.: 17/972,674

(22) Filed: Oct. 25, 2022

(65) Prior Publication Data
US 2023/0133526 A1 May 4, 2023

Related U.S. Application Data

(60) Provisional application No. 63/272,802, filed on Oct. 28, 2021.

(51) Int. Cl.
*H01L 23/00* (2006.01)
(52) U.S. Cl.
CPC .............. *H01L 24/81* (2013.01); *H01L 24/75* (2013.01); *H01L 2224/759* (2013.01); *H01L 2224/81065* (2013.01); *H01L 2224/81091* (2013.01); *H01L 2224/81097* (2013.01); *H01L 2224/81203* (2013.01); *H01L 2224/81207* (2013.01);
(Continued)

(58) Field of Classification Search
CPC ... H01L 24/81; H01L 24/75; H01L 2224/759; H01L 2224/81065; H01L 2224/81091; H01L 2224/81097; H01L 2224/81203; H01L 2224/81207; H01L 2224/81908; H01L 2924/365; H01L 21/67253; H01L 22/20; H01L 2021/60202; H01L 2224/751; G01N 2021/3595
USPC ....................................................... 438/455
See application file for complete search history.

(56) References Cited

U.S. PATENT DOCUMENTS

| 10,861,820 | B2 | 12/2020 | Bajwa |
| 11,205,633 | B2 | 12/2021 | Bajwa et al. |
| 2021/0265303 | A1 | 8/2021 | Bajwa et al. |

FOREIGN PATENT DOCUMENTS

| JP | H1174314 A | * | 3/1999 | ............ H01L 21/00 |
| JP | 2010045071 A | * | 2/2010 | |

(Continued)

*Primary Examiner* — Norman D Richards
*Assistant Examiner* — Laura M Dykes
(74) *Attorney, Agent, or Firm* — Christopher M. Spletzer, Sr.

(57) ABSTRACT

A bonding system for bonding a semiconductor element to a substrate is provided. The bonding system includes a bond head assembly for bonding a semiconductor element to a substrate at a bonding area of the bonding system; a reducing gas delivery system for providing a reducing gas to the bonding area during bonding of the semiconductor element to the substrate; and a gas composition analyzer configured for continuously monitoring a composition of the reducing gas during operation of the bonding system.

21 Claims, 7 Drawing Sheets

(52) U.S. Cl.
CPC ............... *H01L 2224/81908* (2013.01); *H01L 2924/365* (2013.01)

(56) References Cited

FOREIGN PATENT DOCUMENTS

JP          2011121102  A  *  6/2011
WO     WO-2020146466  A1  *  7/2020   ............. H01L 24/81

\* cited by examiner

BONDING SYSTEMS FOR BONDING OF SEMICONDUCTOR ELEMENTS TO SUBSTRATES INCLUDING A GAS COMPOSITION ANALYZER, AND RELATED METHODS

CROSS-REFERENCE TO RELATED APPLICATION

This application claims the benefit of U.S. Provisional Application No. 63/272,802, filed Oct. 28, 2021, the content of which is incorporated herein by reference.

FIELD

The invention relates to bonding systems and processes (such as flip chip, thermocompression, and thermosonic bonding systems and processes), and more particularly, to improved systems and methods for bonding a semiconductor element to a substrate.

BACKGROUND

Traditional semiconductor packaging typically involves die attach processes and wire bonding processes. Advanced semiconductor packaging technologies (e.g., flip chip bonding, thermocompression bonding, etc.) continue to gain traction in the industry. For example, in thermocompression bonding (i.e., TCB), heat and/or pressure (and sometimes ultrasonic energy) are used to form a plurality of interconnections between (i) electrically conductive structures on a semiconductor element and (ii) electrically conductive structures on a substrate.

In certain flip chip bonding or thermocompression bonding applications, the electrically conductive structures of the semiconductor element and/or the substrate may include copper structures (e.g., copper pillars) or other material(s) that are subject to oxidation and/or other contamination. In such applications, it is desirable to provide an environment suitable for bonding. Conventionally, such an environment may be provided by using a reducing gas at the bonding area to reduce potential oxidation and/or contamination of the electrically conductive structures of the semiconductor element or the substrate to which it will be bonded.

Exemplary technologies related to bonding using a reducing gas are disclosed in the following patent documents, each of which is incorporated by reference herein: U.S. Pat. No. 10,861,820 (entitled "METHODS OF BONDING SEMICONDUCTOR ELEMENTS TO A SUBSTRATE, INCLUDING USE OF A REDUCING GAS, AND RELATED BONDING MACHINES"); U.S. Pat. No. 11,205,633 (entitled "METHODS OF BONDING OF SEMICONDUCTOR ELEMENTS TO SUBSTRATES, AND RELATED BONDING SYSTEMS"); and U.S. Patent Application Publication No. 2021/0265303 (entitled "METHODS OF BONDING OF SEMICONDUCTOR ELEMENTS TO SUBSTRATES, AND RELATED BONDING SYSTEMS").

It would be desirable to provide improved methods of bonding semiconductor elements to a substrate with the use of a reducing gas.

SUMMARY

According to an exemplary embodiment of the invention, a bonding system for bonding a semiconductor element to a substrate is provided. The bonding system includes a bond head assembly for bonding a semiconductor element to a substrate at a bonding area of the bonding system; a reducing gas delivery system for providing a reducing gas to the bonding area during bonding of the semiconductor element to the substrate; and a gas composition analyzer configured for continuously monitoring a composition of the reducing gas during operation of the bonding system.

According to another exemplary embodiment of the invention, a method of bonding a semiconductor element to a substrate is provided. The method includes the steps of: (a) providing a reducing gas to a bonding area of a bonding system during bonding of a semiconductor element to a substrate; and (b) continuously monitoring a composition of the reducing gas during operation of the bonding system using a gas composition analyzer.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity.

DETAILED DESCRIPTION

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "substrate" is intended to refer to any structure to which a semiconductor element may be bonded. Exemplary substrates include, for example, a leadframe, a PCB, a carrier, a module, a semiconductor chip, a semiconductor wafer, a BGA substrate, another semiconductor element, etc.

As used herein, the term "bonding system" is intended to refer to any type of system or machine configured for bonding a semiconductor element to a substrate. Exemplary bonding systems include thermocompression bonding systems (TCB), thermosonic bonding systems, flip chip bonding systems, die attach systems, laser assisted bonding systems, etc.

In accordance with certain exemplary embodiments of the invention, a fluxless bonding system is provided using a reducing gas.

Aspects of the invention relate to a novel fluxless chip-to-substrate or chip-to-wafer system that avoids oxidation of metal and solder pads during bonding (e.g., during thermocompression bonding).

Exemplary systems include a "substrate oxide reduction chamber" (also referred to as a substrate cleaning compartment), a "substrate oxide prevention chamber" (also referred to as a substrate protection compartment), and a "reducing gas delivery system" (e.g., a localized chip and substrate oxide reduction bond head shroud, or other reducing gas delivery system) to eliminate the use of a fluxing process.

Aspects of the invention relate to using a reducing gas measurement system (e.g., a gas sampling system) (e.g., in a pump loop) to continuously monitor the reducing gas composition/concentration in a system that has a non-constant flow (i.e., the reducing gas may not always be flowing in the system at the same flow rate, or at all).

Exemplary aspects of the invention use a sampling pump and a tubing loop to continuously flow a reducing gas (e.g., formic acid vapor) from a reducing gas source (e.g., piping from a source, a pressurized vessel, a bubbler system, such as a formic acid bubbler system, etc.) through a gas composition analyzer at a constant rate.

Aspects of the invention provide a number of potential benefits over conventional systems and methods. For example, aspects of the invention decouple system flow and measurement system flow requirements. As such, if the system flow changes suddenly (which is needed on bonding systems such as thermocompression bonding machines), errors due to changing flow are not experienced by the gas composition analyzer. Further, a reducing gas sampling loop (e.g., a bubbler sampling loop) can perform measurements without requiring system process flow. Further still, using the inventive systems and methods, a reducing gas composition may be maintained within a desired tolerance.

Each of FIGS. 1-6 illustrates a gas distribution system 170 that includes an enclosure 160. Gas distribution system 170 provides a reducing gas 126 and a shielding gas 128, as described in more detail below. Enclosure 160 houses (i) a vapor generation system 122, (ii) a gas supply 118 (providing a carrier gas 118*a*), and (iii) a gas composition analyzer 150. Gas composition analyzer 150 (e.g., a binary gas analyzer, a Fourier-transform infrared spectroscope (FTIR) gas analyzer, a mass spectrometer gas analyzer, a mass spectrometer in combination with a gas chromatograph, etc.) is configured for continuously monitoring a composition of a reducing gas (e.g., formic acid vapor) during operation of the bonding system 100, 100", 300, 400, 300', and 400' (see FIGS. 1-6). Gas composition analyzer 150 represents an analyzer including elements not shown, but required in certain applications, such as valves, pumps, flowmeters (e.g., mass flowmeters), etc. In the illustrated examples, vapor generation system 122 is a bubbler type system including an acid fluid 124 (e.g., formic acid, acetic acid, etc.) in a vessel 122*a* of the bubbler type system. A carrier gas 118*a* (e.g., nitrogen) is provided via piping 120 into acid fluid 124 in vessel 122*a*, where the carrier gas 118*a* acts as a carrier for the acid fluid 124. Collectively, carrier gas 118*a* (e.g., nitrogen) and acid fluid 124 are transported as reducing gas 126. Further, it is understood that certain optional elements of the vapor generation system 122 (e.g., a valve(s) used to add/remove acid fluid 124 to vessel 122*a* to maintain a certain fluid level) are omitted from the illustrations for simplicity. It is understood that carrier gas 118*a* and reducing gas 126 are flowing within piping 120; however, FIGS. 1-6 illustrate carrier gas 118*a* and reducing gas 126 with an arrow outside of piping 120 to increase clarity in the figures.

Although certain embodiments of the invention have been illustrated and described herein with reference to a reducing gas source that includes a bubbler type vapor generation system, the invention is not limited thereto. It is contemplated that the reducing gas source may have a number of different configurations such as a pressurized vessel containing reducing gas, a source of reducing gas that is common to a plurality of bonding systems, a connection (e.g., a valve, piping, etc.) for providing a reducing gas, etc.

Gas composition analyzer 150 may be configured to continuously monitor/analyze the composition of the reducing gas 126 during operation of the bonding system (e.g., at any time before, during, and/or after a bonding operation). The composition that is monitored/analyzed may be a breakdown of the elements of the reducing gas, for example, by weight, by volume, etc. (e.g., the percentage of formic acid versus the percentage of carrier gas). As used herein, the expression "during operation of the bonding system" means that the bonding system is ready for bonding (e.g., it is powered on so that bonding of a semiconductor element could occur) but an actual bonding operation may (or may not) be occurring. At a minimum, in order to be ready for bonding, gas composition analyzer 150 must be turned on such that the continuous monitoring may be performed. As such, "during operation of the bonding system" may include any time before, during, and/or after a bonding operation.

Further, gas composition analyzer 150 may be configured to monitor whether the composition of reducing gas 126 meets at least one criteria (e.g., percent weight of formic acid, percent volume of formic acid, saturation level, a desired composition, etc.). For example, such criteria for the reducing gas in some applications is the percentage of formic acid versus carrier gas (e.g., nitrogen) by weight. Exemplary ranges for the formic acid vapor (e.g., that meet the at least one criteria) in connection with the invention include: 1-16% formic acid by weight (and 84-99% nitrogen by weight); 2-15% formic acid by weight (and 85-98% nitrogen by weight); and 5-10% formic acid by weight (and 90-95% nitrogen by weight). Of course, the percentage of formic acid (or other acid fluid, such as acetic acid) by weight is just one example of a "criteria" within the scope of the invention. Another example criteria would be to detect if the formic acid (or other acid compound used in the reducing gas) is saturated in the carrier gas (e.g., in the nitrogen). Additional and/or different criteria may be defined, for example, by an operator.

Bonding systems 100, 100", 300, 400, 300', and 400' (see FIGS. 1-6), in connection with gas composition analyzer 150, may be configured to alert an operator (e.g., user) when a given criteria is (or is not) met.

Bonding systems 100, 100", 300, 400, 300', and 400' (see FIGS. 1-6), in connection with gas composition analyzer 150, may be configured to adjust the composition of the reducing gas 126 if the composition of the reducing gas 126 does not meet at least one criteria. For example, bonding systems 100, 100", 300, 400, 300', and 400' may automatically adjust operations or settings (e.g., adjust the temperature and/or pressure of the vapor generation system 122, adjust the fill level of the formic acid in the bubbler, etc.) to achieve a desired composition of reducing gas 126.

In certain embodiments of the invention, reducing gas 126 must meet the at least one criteria (e.g., an acceptable chemical composition) prior to the bonding system 100, 100", 300, 400, 300', and 400' being ready for bonding (e.g., before the bonding system can engage in a bonding operation).

Figure 1:
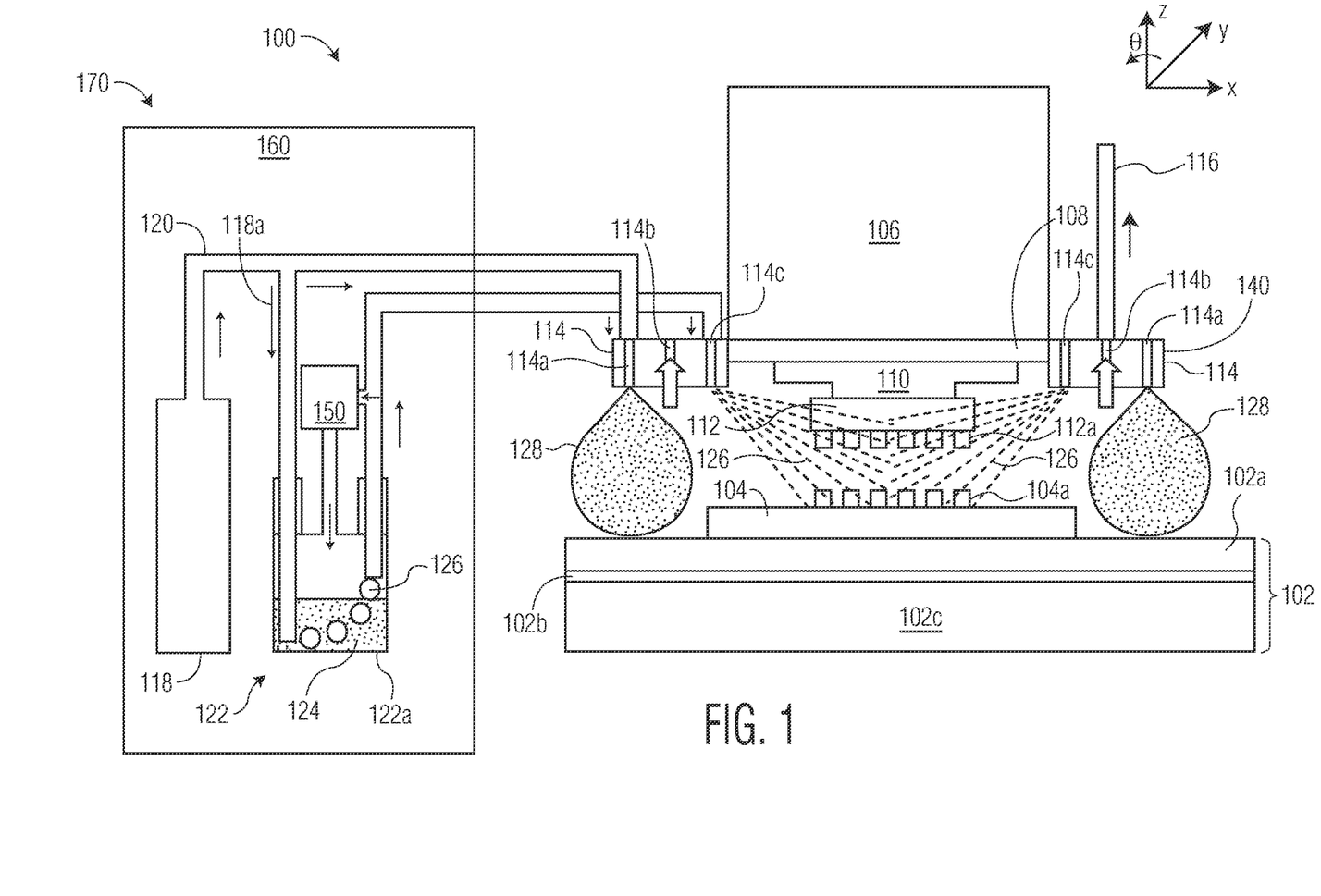
FIG. 1 is a block diagram illustration of a bonding system for bonding a semiconductor element to a substrate in accordance with an exemplary embodiment of the invention.

Referring now specifically to FIG. 1, a bonding system 100 is provided. Bonding system 100 includes a support structure 102 for supporting a substrate 104 during a bonding operation (where substrate 104 includes a plurality of electrically conductive structures 104a). Support structure 102 may include any appropriate structure for the specific application. In FIG. 1, support structure 102 includes top plate 102a (configured to directly support substrate 104), chuck 102c, and heater 102b disposed therebetween. In applications where heat for heating substrate 104 is desirable in connection with the bonding operation, a heater such as heater 102b may be utilized.

Bonding system 100 also includes bond head assembly 106, which may be configured to move along (and about) a plurality of axes of bonding system 100 such as, for example, the x-axis, y-axis, z-axis, theta (rotative) axis, etc. Bond head assembly 106 includes heater 108 and bonding tool 110. That is, in certain bonding systems (e.g., thermocompression bonding machines) it may be desirable to heat the bonding tool. Thus, while FIG. 1 illustrates a separate heater 108 for heating bonding tool 110 (for heating semiconductor element 112 including a plurality of electrically conductive structures 112a), it will be appreciated that heater 108 and bonding tool 110 may be integrated into a single element (e.g., a heated bonding tool).

In connection with a bonding operation, semiconductor element 112 is bonded to substrate 104 using bonding tool 110. During the bonding operation, corresponding ones of electrically conductive structures 112a are bonded (e.g., using heat, force, ultrasonic energy, etc.) to respective ones of electrically conductive structures 104a.

In certain bonding applications (e.g., flip chip and/or thermocompression bonding with copper conductive structures), it is desirable to provide an environment suitable for bonding. Conventionally, such an environment may be provided by using a reducing gas at the bonding area to reduce potential contamination of the electrically conductive structures of the semiconductor element or the substrate to which it will be bonded.

Bonding system 100 also includes a reducing gas delivery system 140 for providing a reducing gas 126 to a bonding area during bonding of semiconductor element 112 to substrate 104. Reducing gas delivery system 140 is illustrated as being integrated with bond head assembly 106. Reducing gas delivery system 140 includes a bond head manifold 114 (carried by bond head assembly 106) for receiving and distributing fluids (e.g., gases, vapors, etc.) as desired in the given application. In FIG. 1, while bond head manifold 114 is illustrated in a cross-sectional view, the actual bond head manifold 114 at least partially surrounds bonding tool 110 (e.g., bond head manifold 114 surrounds bonding tool 110 in a coaxial configuration). Of course, bond head manifold 114 may have different configurations from that shown in FIG. 1. Further, it is understood that certain details of bond head manifold 114 (e.g., interconnection with piping 120, structural details for distributing a reducing gas within bond head manifold 114, structural details for distributing a shielding gas within bond head manifold 114, structural details for drawing a vacuum through a center channel of bond head manifold 114, etc.) are omitted for simplicity.

Bond head manifold 114 includes three channels 114a, 114b, 114c having different functions. Outer channel 114a receives a shielding gas 128 (e.g., nitrogen gas) from gas supply 118 (of gas distribution system 170). That is, a shielding gas 128 is provided from gas supply 118 (e.g., a nitrogen supply), through piping 120 (where piping 120 may include hard piping, flexible tubing, a combination of both, or any other structure adapted to carry the fluids described herein), to outer channel 114a of bond head manifold 114. From outer channel 114a of bond head manifold 114, the shielding gas 128 is provided as a shield from the outside environment. Inner channel 114c receives a reducing gas 126 (e.g., where the reducing gas is a saturated vapor gas) from vapor generation system 122 (included as part of gas distribution system 170) via piping 120, and provides reducing gas 126 in the area of semiconductor element 112 and substrate 104 in connection with a bonding operation.

FIG. 1 illustrates gas distribution system 170 (including enclosure 160, a vapor generation system 122, gas supply 118, and gas composition analyzer 150) as part of bonding system 100. Details related to gas composition analyzer 150, and its function, are recited above. As described above, gas composition analyzer 150 may be configured to continuously monitor/analyze the composition of the reducing gas 126 during operation of the bonding system. Also as described above, gas composition analyzer 150 may be configured to monitor whether the composition of the gas meets at least one criteria, and actions may be taken in connection with whether or not the composition meets the at least one criteria.

After reducing gas 126 is distributed in the area of semiconductor element 112 and substrate 104, reducing gas 126 contacts surfaces of each of electrically conductive structures 104a and electrically conductive structures 112a. The surfaces of electrically conductive structures 104a/112a may then include a reaction product (e.g., where the reaction product is provided as a result of (i) a surface oxide on electrically conductive structures 104a/112a, and (ii) reducing gas 126 (and possibly heat provided by heater 108 and transferred to electrically conductive structures 104a via contact with electrically conductive structures 112a, if desired)). This reaction product is desirably removed from the bonding area (i.e., the area where electrically conductive structures 112a of semiconductor element 112 are bonded to corresponding electrically conductive structures 104a of substrate 104) using vacuum provided through center channel 114b of bond head manifold 114 via exit piping 116.

Thus, FIG. 1 illustrates: (i) various elements of bonding system 100; (ii) a path of gas from gas supply 118 (i.e., as shielding gas 128 to outer channel 114a of bond head manifold 114, and as carrier gas 118a); (iii) a path of reducing gas 126 from vapor generation system 122 to inner channel 114c of bond head manifold 114, where it is released to the bonding area as reducing gas 126; and (iv) a path of gas (which may carry away a reaction product from surfaces of electrically conductive structures 104a/112a) drawn by vacuum through center channel 114b of bond head manifold 114.

Semiconductor element 112 (carried by bond head assembly 106) is illustrated positioned above substrate 104. Vapor generation system 122 has been activated to produce reducing gas 126 at the bonding area. More specifically, FIG. 1 illustrates reducing gas 126 being provided at the bonding area, as well as shielding gas 128 being provided, and vacuum being drawn through center channel 114b of bond head manifold 114 via exit piping 116. Thus, the flow of reducing gas 126 reaches desired portions of semiconductor element 112 and substrate 104 (e.g., electrically conductive structures 104a and electrically conductive structures 112a) for: removing contaminants from the electrically conductive structures 104a and electrically conductive structures 112a; and/or shielding electrically conductive structures 104a and electrically conductive structures 112a from further potential contamination.

Also illustrated in FIG. 1, respective ones of electrically conductive structures 112a (of semiconductor element 112) are aligned with ones of electrically conductive structures 104a (of substrate 104). In subsequent steps (not illustrated), the process proceeds to a bonding step (e.g., a thermocompression bonding step), for example, through the lowering of bond head assembly 106. That is, electrically conductive structures 112a are bonded to corresponding electrically conductive structures 104a. This may be through a thermocompression bonding process (e.g., including heat and/or bond force, where the bond force may be a higher bond force such as 50-300 N), and may also include ultrasonic energy transfer (e.g., from an ultrasonic transducer included in bond head assembly 106).

Figure 2:
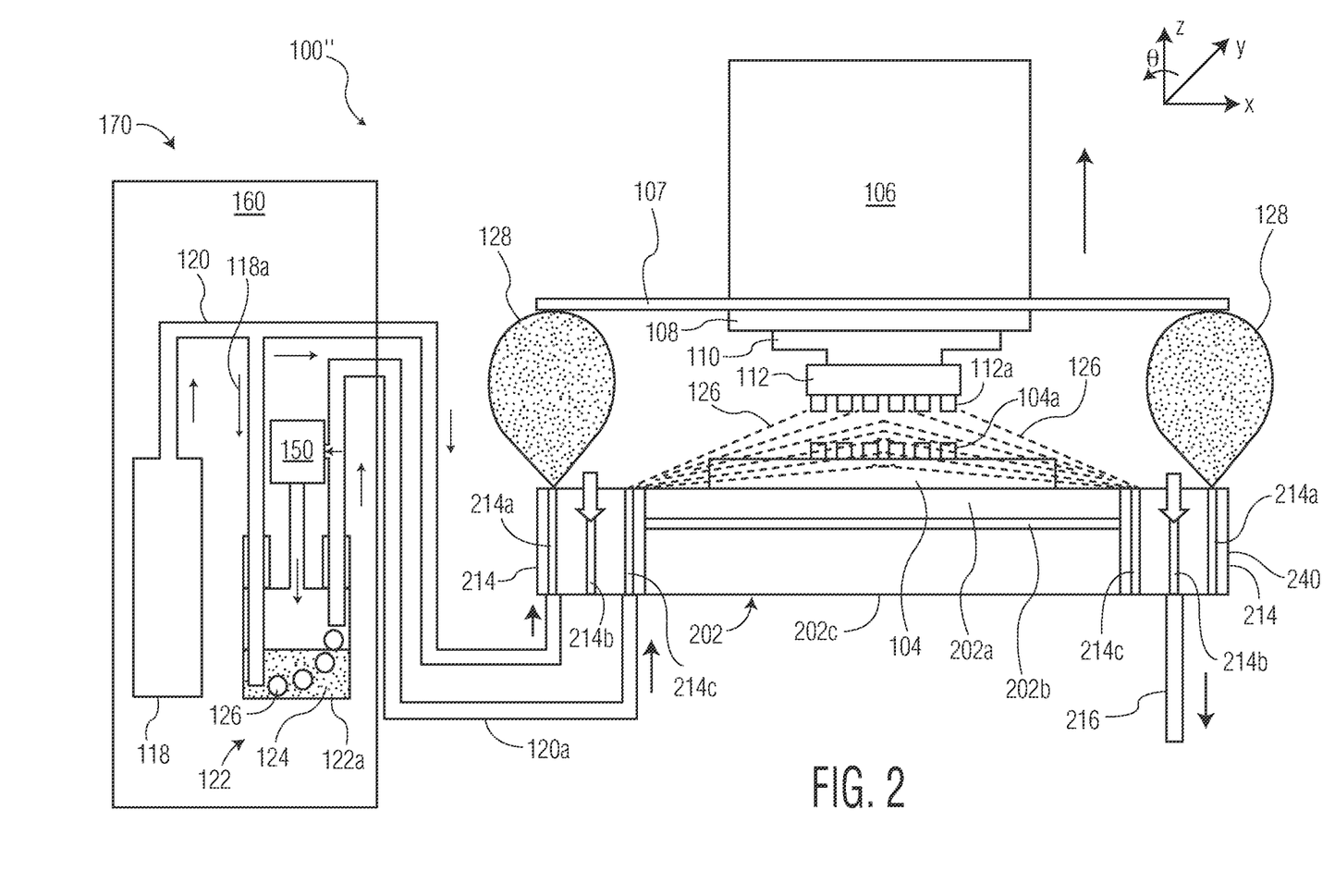
FIG. 2 is a block diagram illustration of another bonding system for bonding a semiconductor element to a substrate in accordance with an exemplary embodiment of the invention.

Although FIG. 1 illustrates an exemplary bond head manifold 114 integrated with the bond head assembly 106 for: delivering the reducing gas; delivering the shielding gas; and providing vacuum, the invention is not limited thereto. For example, instead of such functions being provided through integration of a manifold with the bond head assembly, such functions may be provided through integration with a support structure for supporting the substrate. Further, such functions may be split between the bond head assembly and the support structure (and possibly other structures of the bonding system). FIG. 2 is a block diagram of a bonding system 100″ with certain similar elements and functions to those illustrated and described with respect to FIG. 1, except that the manifold and its functions (delivering the reducing gas; delivering the shielding gas; and providing vacuum) are integrated into a support structure 202.

FIG. 2 illustrates bonding system 100″ (e.g., a bonding machine, a flip chip bonding machine, a thermocompression bonding machine, etc.). Bonding system 100″ includes a support structure 202 for supporting a substrate 104 during a bonding operation (where substrate 104 includes a plurality of electrically conductive structures 104a). Support structure 202 may include any appropriate structure for the specific application. In FIG. 2, support structure 202 includes top plate 202a (configured to directly support substrate 104), chuck 202c, and heater 202b disposed therebetween. In applications where heat for heating substrate 104 is desirable in connection with the bonding operation, a heater such as heater 202b may be utilized.

FIG. 2 also illustrates bond head assembly 106 (including heater 108 and bonding tool 110), which may be configured to move along (and/or about) a plurality of axes of bonding system 100″ such as, for example, the x-axis, y-axis, z-axis, theta (rotative) axis, etc. In FIG. 2, bond head assembly 106 carries a plate 107 for partially containing at least one of shielding gas 128 and reducing gas 126 (see description below).

Bonding system 100″ includes a reducing gas delivery system 240 for providing a reducing gas 126 to a bonding area during bonding of semiconductor element 112 to substrate 104. Reducing gas delivery system 240 is illustrated as being integrated with support structure 202. As opposed to a bond head manifold 114 carried by bond head assembly 106 (as in FIG. 1), FIG. 2 illustrates a manifold 214 carried by, and/or integrated with, support structure 202. Manifold 214 is configured for receiving and distributing fluids (e.g., gases, vapors, etc.) as desired in the given application. In FIG. 2, while manifold 214 is illustrated in a cross-sectional view, the actual manifold 214 at least partially surrounds substrate 104. Of course, manifold 214 may have different configurations from that shown in FIG. 2, while carrying out the functions of receiving and distributing fluids. Further, it is understood that certain details of manifold 214 (e.g., interconnection with piping 120, structural details for distributing reducing gas 126 within manifold 214, structural details for distributing shielding gas 128 within manifold 214, structural details for drawing a vacuum through a center channel of manifold 214, etc.) are omitted for simplicity.

Manifold 214 includes three channels 214a, 214b, 214c having different functions. Outer channel 214a receives shielding gas 128 (e.g., nitrogen gas) from gas supply 118 (of gas distribution system 170). That is, shielding gas 128 is provided from gas supply 118 (e.g., a nitrogen supply), through piping 120 (where piping 120 may include hard piping, flexible tubing, a combination of both, or any other structure adapted to carry the fluids described herein), to outer channel 214a of manifold 214. From outer channel 214a of manifold 214, shielding gas 128 is provided as a shield from the outside environment. Center channel 114b provides a vacuum for removal of reaction product from the bonding area (i.e., the area where electrically conductive structures 112a of semiconductor element 112 are bonded to corresponding electrically conductive structures 104a of substrate 104) via exit piping 116. Inner channel 214c receives reducing gas 126 (e.g., where the reducing gas is a saturated vapor gas) from vapor generation system 122 (included as part of gas distribution system 170) via piping 120a, and provides reducing gas 126 in the area of semiconductor element 112 and substrate 104 in connection with a bonding operation.

FIG. 2 illustrates gas distribution system 170 (including enclosure 160, a vapor generation system 122, gas supply 118, and gas composition analyzer 150) as part of bonding system 100″. Details related to gas composition analyzer 150, and its function, are recited above. As described above, gas composition analyzer 150 may be configured to continuously monitor/analyze the composition of the reducing gas 126 during operation of the bonding system. Also as described above, gas composition analyzer 150 may be configured to monitor whether the composition of the gas meets at least one criteria, and actions may be taken in connection with whether or not the composition meets the at least one criteria.

After reducing gas 126 is distributed in the area of semiconductor element 112 and substrate 104, reducing gas 126 contacts surfaces of each of electrically conductive structures 104a and electrically conductive structures 112a. The surfaces of electrically conductive structures 104a/112a may then include a reaction product (e.g., where the reaction product is provided as a result of: (i) a surface oxide on electrically conductive structures 104a/112a, and (ii) reducing gas 126 (and possibly heat provided by heater 108, if desired)). This reaction product is desirably removed from the bonding area (i.e., the area where electrically conductive structures 112a of semiconductor element 112 are bonded to corresponding electrically conductive structures 104a of substrate 104) using vacuum provided through center channel 214b of manifold 214 via exit piping 216.

Thus, FIG. 2 illustrates: (i) various elements of bonding system 100''; (ii) a path of gas from gas supply 118 (i.e., as shielding gas 128 to outer channel 214a of manifold 214, and as carrier gas 118a); (iii) a path of reducing gas 126 from vapor generation system 122 to inner channel 214c of manifold 214, where it is released to the bonding area as reducing gas 126; and (iv) a path of gas (which may carry away a reaction product from surfaces of electrically conductive structures 104a/112a) drawn by vacuum through center channel 214b of manifold 214. The aforementioned paths are illustrated in FIG. 2 through various arrows.

Referring to FIG. 2, semiconductor element 112 (carried by bond head assembly 106) is positioned above substrate 104. As shown in FIG. 2, vapor generation system 122 has been activated to produce reducing gas 126 at the bonding area. More specifically, FIG. 2 illustrates reducing gas 126 being provided at the bonding area, as well as shielding gas 128 being provided, and vacuum being drawn through center channel 214b of bond head manifold 214 via exit piping 216. Thus, the flow of reducing gas 126 reaches desired portions of semiconductor element 112 and substrate 104 (e.g., electrically conductive structures 104a and electrically conductive structures 112a) for: removing contaminants from the electrically conductive structures 104a and electrically conductive structures 112a; and/or shielding electrically conductive structures 104a and electrically conductive structures 112a from further potential contamination.

Also illustrated in FIG. 2, respective ones of electrically conductive structures 112a (of semiconductor element 112) are aligned with ones of electrically conductive structures 104a (of substrate 104). In subsequent steps, the process proceeds to a bonding step (e.g., a thermocompression bonding step), for example, through the lowering of bond head assembly 106. That is, electrically conductive structures 112a are bonded to corresponding electrically conductive structures 104a. This may be through a thermocompression bonding process (e.g., including heat and/or bond force, where the bond force may be a higher bond force such as 50-300 N), and may also include ultrasonic energy transfer (e.g., from an ultrasonic transducer included in bond head assembly 106).

Figure 3:
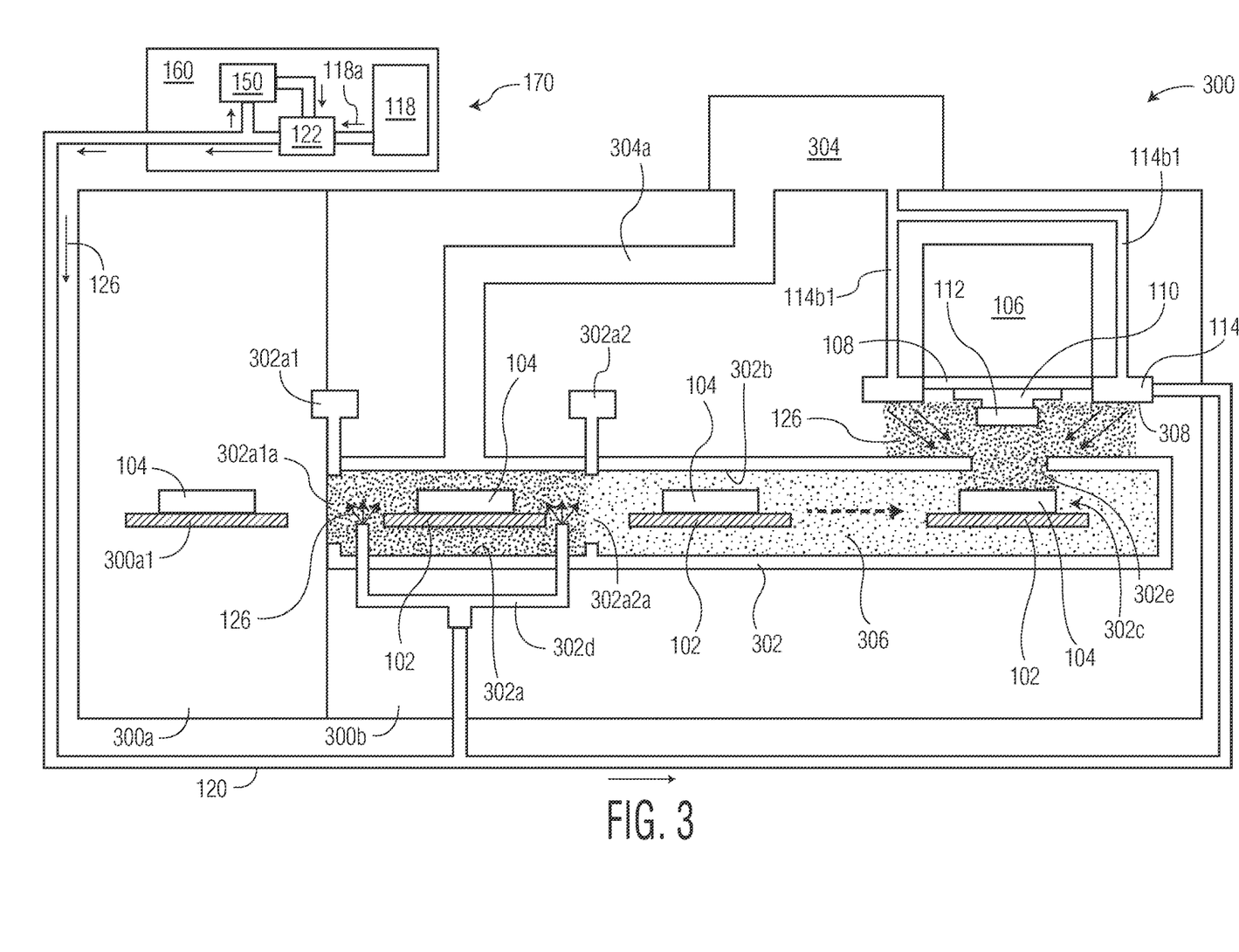
FIG. 3 is a block diagram illustration of yet another bonding system for bonding a semiconductor element to a substrate in accordance with an exemplary embodiment of the invention.

Referring now to FIG. 3, exemplary bonding system 300 is illustrated. Bonding system 300 includes: a substrate source 300a (e.g., a wafer handler or other source) for providing a substrate(s) 104 (such as a wafer, a printed circuit board, etc.) on a support structure 300a1; and a processing system 300b. Substrate 104 is configured to be transferred to processing system 300b (e.g., including a tunnel 302, but may be a different type of structure). Tunnel 302 (or other structure, as desired) includes a substrate oxide reduction chamber 302a, a substrate oxide prevention chamber 302b, and a bonding area 302c (which is part of substrate oxide prevention chamber 302b). A reducing gas delivery system 308 is also included in processing system 300b.

In the example shown in FIG. 3, tunnel 302 is configured such that substrate oxide reduction chamber 302a and substrate oxide prevention chamber 302b have a common boundary. Substrate oxide reduction chamber 302a is closed using entry door 302a1 (which closes opening 302a1a) and exit door 302a2 (which closes opening 302a2a). Another reducing gas delivery system 302d (which is illustrated interconnected, via piping 120, with reducing gas delivery system 308 to use a common source of reducing gas 126 from gas distribution system 170) is provided to provide a reducing gas 126 (e.g., formic acid vapor) in substrate oxide reduction chamber 302a. Although bonding system 300 is illustrated and described herein with reference to a single reducing gas source, the invention is not limited thereto. A plurality of sources of reducing gas are contemplated (e.g., one reducing gas source for each reducing gas location).

FIG. 3 illustrates gas distribution system 170 (including enclosure 160, a vapor generation system 122, gas supply 118, and gas composition analyzer 150) as part of bonding system 300. Details related to gas composition analyzer 150, and its function, are recited above. As described above, gas composition analyzer 150 may be configured to continuously monitor/analyze the composition of the reducing gas 126 during operation of bonding system 300. Also as described above, gas composition analyzer 150 may be configured to monitor whether the composition of the gas meets at least one criteria, and actions may be taken in connection with whether or not the composition meets the at least one criteria.

After processing (e.g., removal of oxides from conductive structures of substrate 104) in substrate oxide reduction chamber 302a, a substrate transfer system (which may be part of a material handling system including support structure 102, and which further may include support structure 300a1) is used to transfer substrate 104 through opening 302a2a to substrate oxide prevention chamber 302b. Substrate oxide prevention chamber 302b includes an inert environment 306 (e.g., through a nitrogen supply, not shown for simplicity). A material handling system (e.g., including support structure 102) is used to move substrate 104 within substrate oxide prevention chamber 302b to a bonding area 302c. While at bonding area 302c, reducing gas 126 is provided by reducing gas delivery system 308.

FIG. 3 also illustrates bond head assembly 106, including heater 108, and bonding tool 110. FIG. 3 also illustrates a main exhaust 304 which pulls exhaust gases (e.g., gases such as reducing gas vapors) through piping 304a and 114b1 (where piping 114b1 is coupled, directly or indirectly, to center channel 114b described above). Bond head assembly 106 carries a bond head manifold 114 for receiving and distributing fluids (e.g., gases, vapors, etc.) as desired in the given application.

In connection with a bonding operation, semiconductor element 112 (which is carried by bond head assembly 106 into tunnel 302 through opening 302e) is bonded to substrate 104 using bonding tool 110. During the bonding operation, corresponding ones of electrically conductive structures of semiconductor element 112 are bonded (e.g., using heat, force, ultrasonic energy, etc.) to respective ones of electrically conductive structures of substrate 104. Bond head manifold 114 (included as part of reducing gas delivery system 308) provides reducing gas 126 (e.g., where the reducing gas is a saturated vapor gas) in the area of semiconductor element 112 and substrate 104 in connection with a bonding operation (in the illustrated example, reducing gas 126 is able to enter tunnel 302 through opening 302e). After reducing gas 126 is distributed in the area of semiconductor element 112 and substrate 104, reducing gas 126 contacts surfaces of each of electrically conductive structures of semiconductor element 112 and substrate 104.

Figure 4:
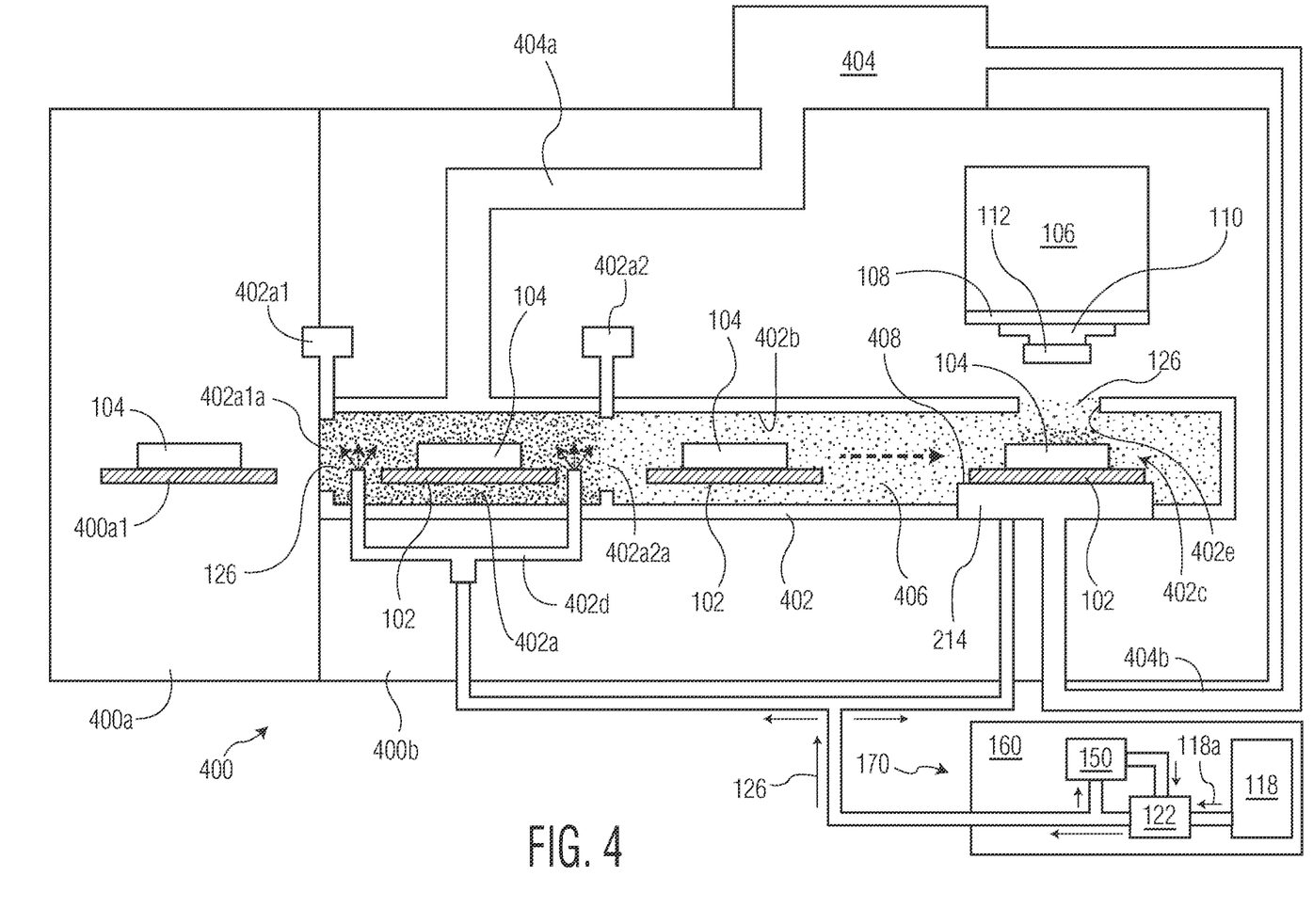
FIG. 4 is a block diagram illustration of yet another bonding system for bonding a semiconductor element to a substrate in accordance with an exemplary embodiment of the invention.

FIG. 4 illustrates exemplary bonding system 400, which is similar in many respects to bonding system 300 of FIG. 3 (where like elements have the same reference numerals, or a numeral beginning with a "4" instead of a "3"). Bonding system 400 includes a substrate source 400a (e.g., a wafer handler or other source) for providing a substrate(s) 104 (such as a wafer, a printed circuit board, etc.) on a support structure 400a1. Substrate 104 is configured to be transferred to processing system 400b (e.g., including a tunnel 402, but may be a different type of structure). Tunnel 402 (or other structure, as desired) includes a substrate oxide reduction chamber 402a, a substrate oxide prevention chamber 402b, and a bonding area 402c (which is part of substrate oxide prevention chamber 402b).

In the example shown in FIG. 4, tunnel 402 is configured such that substrate oxide reduction chamber 402a and substrate oxide prevention chamber 402b have a common boundary. A reducing gas delivery system 408 is also included in processing system 400b. Substrate oxide reduction chamber 402a is closed using entry door 402a1 (which closes opening 402a1a) and exit door 402a2 (which closes opening 402a2a). Another reducing gas delivery system 402d (which is interconnected, via piping 120, with reducing gas delivery system 408 to use a common source of reducing gas 126 from gas distribution system 170) is provided to provide a reducing gas 126 (e.g., formic acid vapor) in substrate oxide reduction chamber 402a.

FIG. 4 illustrates gas distribution system 170 (including enclosure 160, a vapor generation system 122, gas supply 118, and gas composition analyzer 150) as part of bonding system 400. Details related to gas composition analyzer 150, and its function, are recited above. As described above, gas composition analyzer 150 may be configured to continuously monitor/analyze the composition of the reducing gas 126 during operation of the bonding system. Also as described above, gas composition analyzer 150 may be configured to monitor whether the composition of the gas meets at least one criteria, and actions may be taken in connection with whether or not the composition meets the at least one criteria.

After processing (e.g., removal of oxides from conductive structures of substrate 104) in substrate oxide reduction chamber 402a, a substrate transfer system (which may be part of a material handling system including support structure 102, and which further may include support structure 400a1) is used to transfer substrate 104 through opening 402a2a to substrate oxide prevention chamber 402b. Substrate oxide prevention chamber 402b includes an inert environment 406 (e.g., through a nitrogen supply, not shown for simplicity). A material handling system (e.g., including support structure 102) is used to move substrate 104 within substrate oxide prevention chamber 402b to a bonding area 402c. While at bonding area 402c, a reducing gas 126 is provided by reducing gas delivery system 408.

FIG. 4 also illustrates bond head assembly 106, including heater 108, and bonding tool 110. FIG. 4 also illustrates a main exhaust 404 which pulls exhaust gases (e.g., gases such as reducing gas vapors) through piping 404a and 404b. A manifold 214 is provided for receiving and distributing fluids (e.g., gases, vapors, etc.) as desired in the given application. As illustrated in FIG. 4, manifold 214 is carried by and/or integrated with support structure 102, as opposed to the embodiment shown in FIG. 3 (where bond head manifold 114 is carried by the bond head assembly 106).

In connection with a bonding operation, semiconductor element 112 (which is carried by bond head assembly 106 into tunnel 402 through opening 402e) is bonded to substrate 104 using bonding tool 110. During the bonding operation, corresponding ones of electrically conductive structures of semiconductor element 112 are bonded (e.g., using heat, force, ultrasonic energy, etc.) to respective ones of electrically conductive structures of substrate 104. Manifold 214 provides a reducing gas 126 (e.g., where the reducing gas is a saturated vapor gas) in the area of semiconductor element 112 and substrate 104 in connection with a bonding operation. After reducing gas 126 is distributed in the area of semiconductor element 112 and substrate 104, reducing gas 126 contacts surfaces of each of electrically conductive structures of semiconductor element 112 and substrate 104.

Figure 5:
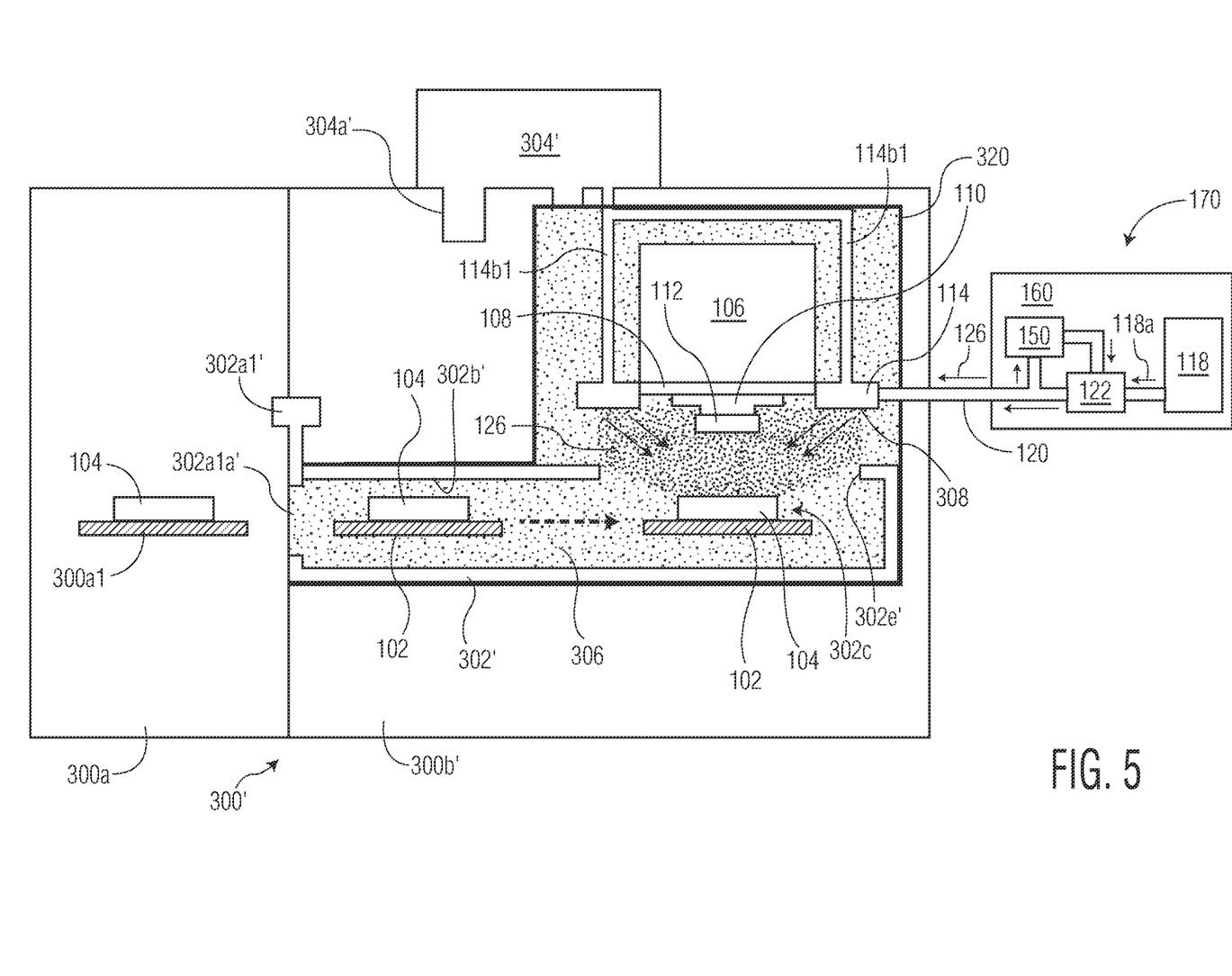
FIG. 5 is a block diagram illustration of yet another bonding system for bonding a semiconductor element, having conductive structures, to a substrate in accordance with an exemplary embodiment of the invention.
Figure 6:
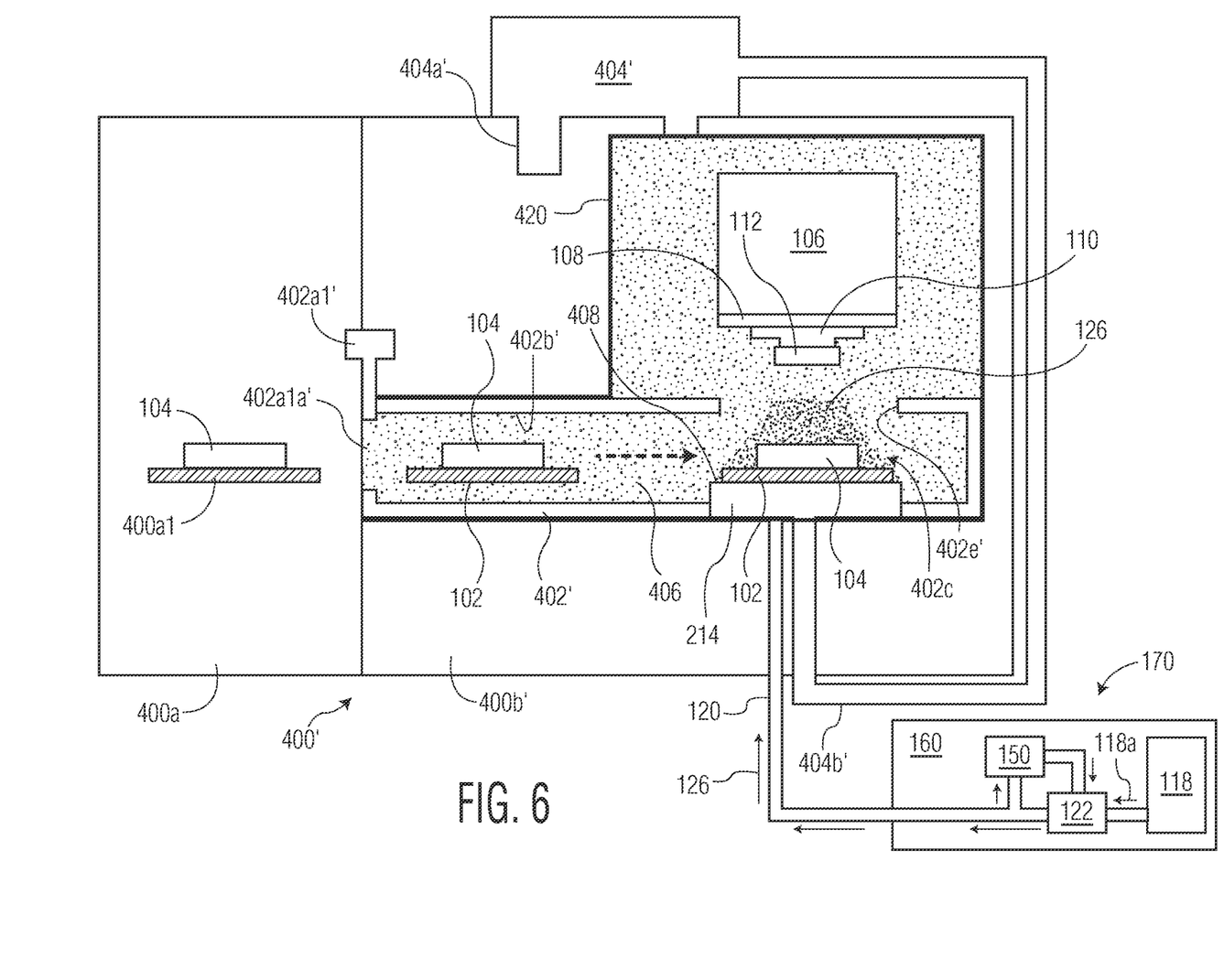
FIG. 6 is a block diagram illustration of yet another bonding system for bonding a semiconductor element, having conductive structures, to a substrate in accordance with an exemplary embodiment of the invention.

While exemplary bonding systems 300, 400 of FIG. 3 and FIG. 4 include substrate oxide reduction chamber 302a, 402a and associated structures, it is contemplated that simplified systems without substrate oxide reduction chamber 302a, 402a and associated structures, are within the scope of the invention, such as the systems of FIG. 5 and FIG. 6.

FIG. 5 illustrates exemplary bonding system 300'. Bonding system 300' includes: a substrate source 300a (e.g., a wafer handler or other source) for providing a substrate(s) 104 (such as a wafer, a printed circuit board, etc.) on a support structure 300a1; and a processing system 300b'. Substrate 104 is configured to be transferred to processing system 300b' (e.g., including an inner environment chamber 320, including a tunnel 302', but may be a different type of structure). Tunnel 302' (or other structure, as desired) includes a substrate oxide prevention chamber 302b' and a bonding area 302c (which is part of substrate oxide prevention chamber 302b'). A reducing gas delivery system 308 is also included in processing system 300b'. Within processing system 300b' (sometimes referred herein as main machine compartment), inner environment chamber 320 may include at least a portion of the substrate oxide prevention chamber 302b' and the reducing gas delivery system 308.

In the example shown in FIG. 5, tunnel 302' includes entry door 302a1' (which closes opening 302a1a'). A substrate transfer system (which may be part of a material handling system including support structure 102) is used to transfer substrate 104 through entry door 302a1' to substrate oxide prevention chamber 302b'. Substrate oxide prevention chamber 302b' includes an inert environment 306 (e.g., through a nitrogen supply, not shown for simplicity). A material handling system (e.g., including support structure 102) is used to move substrate 104 within substrate oxide prevention chamber 302b' to a bonding area 302c. While at bonding area 302c, a reducing gas 126 is provided by reducing gas delivery system 308. Reducing gas delivery system 308 is connected to gas distribution system 170 (which is the same gas distribution system 170 from FIG. 1, FIG. 2, FIG. 3, and FIG. 4) via piping 120.

FIG. 5 illustrates gas distribution system 170 (including enclosure 160, a vapor generation system 122, gas supply 118, and gas composition analyzer 150) as part of bonding system 300'. Details related to gas composition analyzer 150, and its function, are recited above. As described above, gas composition analyzer 150 may be configured to continuously monitor/analyze the composition of the reducing gas 126 during operation of the bonding system. Also as described above, gas composition analyzer 150 may be configured to monitor whether the composition of the gas meets at least one criteria, and actions that may be taken in connection with whether or not the composition meets the at least one criteria.

FIG. 5 also illustrates bond head assembly 106, including heater 108, and bonding tool 110. FIG. 5 also illustrates a main exhaust 304' which pulls exhaust gases (e.g., gases such as reducing gas vapors) from the processing system 300b' (sometimes referred to as the main machine compartment) or the inner environment chamber 320 through piping 304a' and 114b1 (where piping 114b1 is coupled, directly or indirectly, to center channel 114b described above in connection with FIG. 1). Bond head assembly 106 carries a bond head manifold 114 (included as part of reducing gas delivery system 308) for receiving and distributing fluids (e.g., gases, vapors, etc.) as desired in the given application. Details of an exemplary bond head assembly 106, carrying exemplary bond head manifold 114 (included as part of reducing gas delivery system 108), are described above in connection with FIG. 1.

In connection with a bonding operation, semiconductor element 112 (which is carried by bond head assembly 106 into tunnel 302' through opening 302e') is bonded to substrate 104 using bonding tool 110. During the bonding operation, corresponding ones of electrically conductive structures of semiconductor element 112 are bonded (e.g., using heat, force, ultrasonic energy, etc.) to respective ones of electrically conductive structures of substrate 104. Bond head manifold 114 provides a reducing gas 126 (e.g., where the reducing gas is a saturated vapor gas) in the area of semiconductor element 112 and substrate 104 in connection with a bonding operation (in the illustrated example, reducing gas 126 is able to enter tunnel 302' through opening 302e'). After reducing gas 126 is distributed in the area of semiconductor element 112 and substrate 104, reducing gas 126 contacts surfaces of each of electrically conductive structures of semiconductor element 112 and substrate 104.

FIG. 6 illustrates exemplary bonding system 400', which is similar in many respects to bonding system 300' of FIG. 5 (where like elements have the same reference numerals, or a numeral beginning with a "4" instead of a "3"). Bonding system 400' includes a substrate source 400a (e.g., a wafer handler or other source) for providing a substrate(s) 104 (such as a wafer, a printed circuit board, etc.) on a support structure 400a1. Substrate 104 is configured to be transferred to a processing system 400b' (e.g., including an inner environment chamber 420, including a tunnel 402', but may be a different type of structure). Tunnel 402' (or other structure, as desired) includes a substrate oxide prevention chamber 402b' and a bonding area 402c (which is part of substrate oxide prevention chamber 402b'). Within processing system 400b' (sometimes referred herein as main machine compartment), inner environment chamber 420 may include at least a portion of the substrate oxide prevention chamber 402b' and the reducing gas delivery system 408.

In the example shown in FIG. 6, tunnel 402' includes a substrate oxide prevention chamber 402b'. A reducing gas delivery system 408 is included in processing system 400b'. Substrate oxide prevention chamber 402b' is closed using entry door 402a1' (which closes opening 402a1a'). A substrate transfer system (which may be part of a material handling system including support structure 102) is used to transfer substrate 104 through opening 402a1a' to substrate oxide prevention chamber 402b'. Substrate oxide prevention chamber 402b' includes an inert environment 406 (e.g., through a nitrogen supply, not shown for simplicity). A material handling system (e.g., including support structure 102) is used to move substrate 104 within substrate oxide prevention chamber 402b' to a bonding area 402c. While at bonding area 402c, a reducing gas 126 is provided by reducing gas delivery system 408. Reducing gas delivery system 408 is connected to gas distribution system 170 (which is the same gas distribution system 170 from FIG. 1, FIG. 2, FIG. 3, FIG. 4, and FIG. 5) via piping 120.

FIG. 6 illustrates gas distribution system 170 (including enclosure 160, a vapor generation system 122, gas supply 118, and gas composition analyzer 150) as part of bonding system 400'. Details related to gas composition analyzer 150, and its function, are recited above. As described above, gas composition analyzer 150 may be configured to continuously monitor/analyze the composition of the reducing gas 126 during operation of the bonding system. Also as described above, gas composition analyzer 150 may be configured to monitor whether the composition of the gas meets at least one criteria, and actions that may be taken in connection with whether or not the composition meets the at least one criteria.

FIG. 6 also illustrates bond head assembly 106, including heater 108, and bonding tool 110. FIG. 6 also illustrates a main exhaust 404' which pulls exhaust gases (e.g., gases such as reducing gas vapors) from the processing area 400b' (sometimes referred to as the main machine compartment) or the inner environment chamber 420 through piping 404a' and 404b'. A manifold 214 is provided for receiving and distributing fluids (e.g., gases, vapors, etc.) as desired in the given application. As illustrated in FIG. 6, manifold 214 is carried by and/or integrated with support structure 102, as opposed to the embodiment shown in FIG. 5 (where bond head manifold 114 is carried by the bond head assembly 106).

In connection with a bonding operation, semiconductor element 112 (which is carried by bond head assembly 106 into tunnel 402' through opening 402e') is bonded to substrate 104 using bonding tool 110. During the bonding operation, corresponding ones of electrically conductive structures of semiconductor element 112 are bonded (e.g., using heat, force, ultrasonic energy, etc.) to respective ones of electrically conductive structures of substrate 104. Manifold 214 provides a reducing gas 126 (e.g., where the reducing gas 126 is a saturated vapor gas) in the area of semiconductor element 112 and substrate 104 in connection with a bonding operation. After reducing gas 126 is distributed in the area of semiconductor element 112 and substrate 104, reducing gas 126 contacts surfaces of each of electrically conductive structures of semiconductor element 112 and substrate 104.

Figure 7:
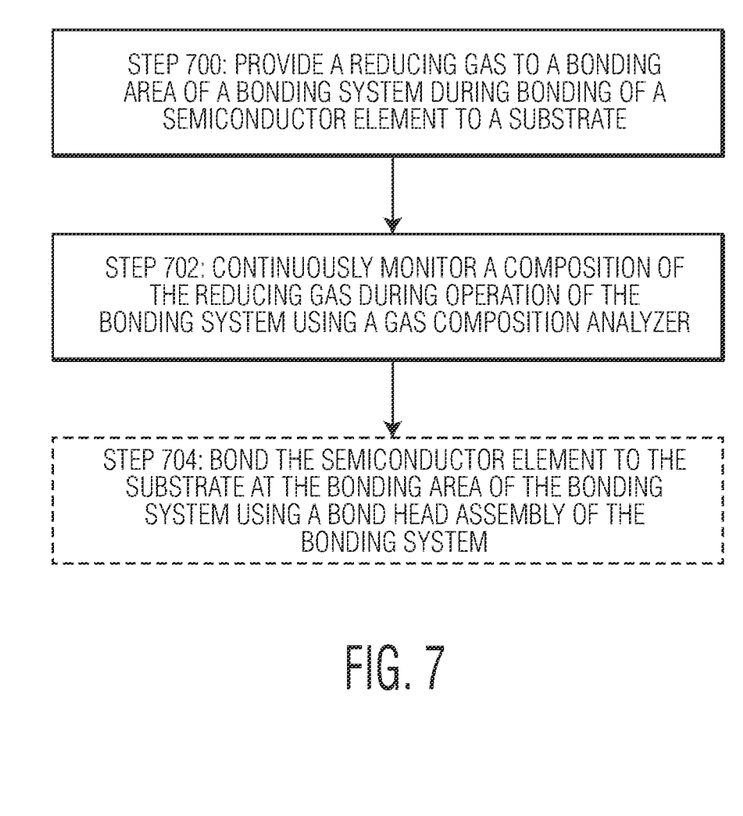
FIG. 7 is a flow diagram illustrating a method of bonding a semiconductor element to a substrate in accordance with an exemplary embodiment of the invention.

FIG. 7 is a flow diagram illustrating an exemplary method of bonding a semiconductor element to a substrate. As is understood by those skilled in the art, certain steps included in the flow diagrams may be omitted; certain additional steps may be added; and the order of the steps may be altered from the order illustrated—all within the scope of the invention.

At Step 700, a reducing gas (e.g., formic acid vapor) is provided to a bonding area of a bonding system (e.g., see bonding systems 100, 100", 300, 400, 300' and 400' described herein) during bonding of a semiconductor element to a substrate. At Step 702, a composition of the reducing gas is continuously monitored during operation of the bonding system using a gas composition analyzer (e.g., a binary gas analyzer, an FTIR gas analyzer, a mass spectrometer gas analyzer, etc.). The gas composition analyzer may be configured to monitor whether the composition of the reducing gas meets at least one criteria (e.g., percent weight of formic acid, percent volume of formic acid, saturation level, a desired composition, etc.) and to alert an operator or adjust the composition of the reducing gas if the composition of the reducing gas does not meet the at least one criteria. At optional Step 704, the semiconductor element is bonded to the substrate at the bonding area of the bonding system using a bond head assembly of the bonding system.

Although the invention has been illustrated primarily with respect to one of bond head manifold 114 and manifold 214 for directing (i) the flow of reducing gas 126, (ii) the flow of shielding gas 128, and (iii) the pull of the vacuum, it is understood that the structure used to direct the flow patterns may be different from that illustrated. That is, the configuration of the structure used to provide and direct fluids (e.g., reducing gas 126, shielding gas 128, etc.) (and to draw vacuum) may vary considerably from that shown.

Although the invention has been described and illustrated with respect to the exemplary embodiments thereof, it should be understood by those skilled in the art that the foregoing and various other changes, omissions and additions may be made therein and thereto, without parting from the spirit and scope of the present invention. Rather, various modifications may be made in the details within the scope and range of equivalents of the claims and without departing from the invention.

What is claimed:

1. A bonding system for bonding a semiconductor element to a substrate, the bonding system comprising:
- a bond head assembly for bonding a semiconductor element to a substrate at a bonding area of the bonding system;
- a reducing gas delivery system for providing a reducing gas to the bonding area during bonding of the semiconductor element to the substrate; and
- a gas composition analyzer configured for continuously monitoring a composition of the reducing gas during operation of the bonding system, the gas composition analyzer monitoring the composition of the reducing gas from a reducing gas source upstream of the bonding area.

2. The bonding system of claim 1 wherein the reducing gas is a formic acid vapor, and wherein the gas composition analyzer is configured for continuously monitoring a composition of the formic acid vapor.

3. The bonding system of claim 1 wherein the reducing gas is a formic acid vapor including nitrogen, and wherein the gas composition analyzer is configured for continuously monitoring a composition of the formic acid vapor.

4. The bonding system of claim 1 wherein the gas composition analyzer includes at least one of a binary gas analyzer, an FTIR gas analyzer, and a mass spectrometer gas analyzer.

5. The bonding system of claim 1 wherein the gas composition analyzer monitors whether the composition of the reducing gas meets at least one criteria.

6. The bonding system of claim 5 wherein the bonding system is configured to alert an operator if the composition of the reducing gas does not meet the at least one criteria.

7. The bonding system of claim 5 wherein the bonding system is configured to adjust the composition of the reducing gas if the composition of the reducing gas does not meet the at least one criteria.

8. The bonding system of claim 1 wherein the reducing gas delivery system is integrated with the bond head assembly.

9. The bonding system of claim 1 further comprising a substrate support structure for supporting the substrate during bonding of the semiconductor element to the substrate, and wherein the reducing gas delivery system is integrated with the substrate support structure.

10. The bonding system of claim 1 further comprising a substrate oxide prevention chamber configured to receive the substrate prior to bonding of the semiconductor element to the substrate, the substrate oxide prevention chamber having an inert environment when receiving the substrate.

11. The bonding system of claim 10 further comprising a substrate oxide reduction chamber configured to receive the substrate prior to receipt of the substrate by the substrate oxide prevention chamber, the reducing gas being provided by the reducing gas source, each of the reducing gas delivery system and the substrate oxide reduction chamber being configured to receive the reducing gas from the reducing gas source.

12. The bonding system of claim 1 further comprising a substrate oxide reduction chamber configured to receive the substrate prior to bonding of the semiconductor element to the substrate, the reducing gas being provided by the reducing gas source, each of the reducing gas delivery system and the substrate oxide reduction chamber configured to receive the reducing gas from the reducing gas source.

13. The bonding system of claim 1 wherein the semiconductor element is a semiconductor die.

14. The bonding system of claim 13 wherein the substrate is a semiconductor wafer.

15. A method of bonding a semiconductor element to a substrate, the method comprising the steps of:
- (a) providing a reducing gas to a bonding area of a bonding system during bonding of a semiconductor element to a substrate; and
- (b) continuously monitoring a composition of the reducing gas during operation of the bonding system using a gas composition analyzer, the gas composition analyzer monitoring the composition of the reducing gas from a reducing gas source upstream of the bonding area.

16. The method of claim 15 further comprising the step of bonding the semiconductor element to the substrate at the bonding area of the bonding system using a bond head assembly of the bonding system.

17. The method of claim 15 wherein the reducing gas is a formic acid vapor, and wherein step (b) includes continuously monitoring the composition of the formic acid vapor.

18. The method of claim 15 wherein the gas composition analyzer includes at least one of a binary gas analyzer, an FTIR gas analyzer, and a mass spectrometer gas analyzer.

19. The method of claim 15 wherein the gas composition analyzer monitors whether the composition of the reducing gas meets at least one criteria.

20. The method of claim 19 wherein the bonding system is configured to alert an operator if the composition of the reducing gas does not meet the at least one criteria.

21. The method of claim 19 wherein the bonding system is configured to adjust the composition of the reducing gas if the composition of the reducing gas does not meet the at least one criteria.

* * * * *